(12) United States Patent
Nojima et al.

(10) Patent No.: US 11,214,711 B2
(45) Date of Patent: Jan. 4, 2022

(54) POLISHING COMPOSITION, METHOD FOR PRODUCING SAME, AND POLISHING METHOD

(71) Applicant: SHIN-ETSU CHEMICAL CO., LTD., Tokyo (JP)

(72) Inventors: Yoshihiro Nojima, Annaka (JP); Mitsuhito Takahashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 257 days.

(21) Appl. No.: 15/579,844

(22) PCT Filed: May 6, 2016

(86) PCT No.: PCT/JP2016/002249
§ 371 (c)(1),
(2) Date: Dec. 5, 2017

(87) PCT Pub. No.: WO2016/199340
PCT Pub. Date: Dec. 15, 2016

(65) Prior Publication Data
US 2018/0355212 A1    Dec. 13, 2018

(30) Foreign Application Priority Data
Jun. 8, 2015  (JP) .............................. JP2015-115739

(51) Int. Cl.
*B24D 3/02*         (2006.01)
*C09K 3/14*         (2006.01)
(Continued)

(52) U.S. Cl.
CPC ................ *C09G 1/02* (2013.01); *C01B 15/01* (2013.01); *C01G 25/02* (2013.01); *C08L 29/04* (2013.01);
(Continued)

(58) Field of Classification Search
USPC .......................................... 51/293, 307, 309
See application file for complete search history.

(56) References Cited

U.S. PATENT DOCUMENTS 7,052,373 B1     5/2006  Fang et al.
8,864,860 B2 *  10/2014  Hirano ................ C09K 3/1463
                                                            51/307
(Continued)

FOREIGN PATENT DOCUMENTS

CN      1451710 A     10/2003
CN    101103444 A      1/2008
(Continued)

OTHER PUBLICATIONS

Oct. 2, 2018 Office Action issued in Japanese Patent Application No. 2015-115739.
(Continued)

*Primary Examiner* — James E McDonough
(74) *Attorney, Agent, or Firm* — Oliff PLC

(57) ABSTRACT

The present invention is a polishing composition, containing zirconium oxide as abrasive grains, the polishing composition having pH of 11.0 or more and less than 12.5, the zirconium oxide having element concentrations of sodium, magnesium, aluminum, potassium, calcium, titanium, chromium, iron, manganese, nickel, copper, zinc, lead, and cobalt of less than 1 ppm each. There can be provided a polishing composition that enables semiconductor substrates having high flatness not only in the inner circumferential portion but also in the outer circumferential portion with little contamination due to metal impurities to be obtained at high productivity.

21 Claims, 1 Drawing Sheet

(51) Int. Cl.
*C09G 1/02* (2006.01)
*H01L 21/02* (2006.01)
*H01L 21/304* (2006.01)
*C01B 15/01* (2006.01)
*C01G 25/02* (2006.01)
*C08L 29/04* (2006.01)
*C08L 33/02* (2006.01)
*C08L 33/26* (2006.01)
*C08L 71/02* (2006.01)
*C08L 81/08* (2006.01)
*C09G 1/16* (2006.01)
*B24D 3/00* (2006.01)
*B24D 11/00* (2006.01)
*B24D 18/00* (2006.01)

(52) U.S. Cl.
CPC ............ *C08L 33/02* (2013.01); *C08L 33/26* (2013.01); *C08L 71/02* (2013.01); *C08L 81/08* (2013.01); *C09G 1/16* (2013.01); *C09K 3/1463* (2013.01); *H01L 21/02024* (2013.01); *H01L 21/304* (2013.01); *C01P 2002/02* (2013.01); *C01P 2002/30* (2013.01); *C01P 2004/32* (2013.01); *C01P 2004/64* (2013.01); *C01P 2006/80* (2013.01)

(56) References Cited

U.S. PATENT DOCUMENTS

| | | | |
|---|---|---|---|
| 2001/0049912 | A1 | 12/2001 | Motonari et al. |
| 2004/0132305 | A1 | 7/2004 | Nishimoto et al. |
| 2009/0302266 | A1* | 12/2009 | Takemura ........... H01L 21/3212 252/79.1 |
| 2010/0187540 | A1 | 7/2010 | Ishibashi et al. |
| 2012/0171936 | A1* | 7/2012 | Haerle .................. B24B 37/044 451/59 |
| 2013/0313225 | A1 | 11/2013 | Jin et al. |
| 2014/0051335 | A1 | 2/2014 | Morinaga et al. |

FOREIGN PATENT DOCUMENTS

| | | | |
|---|---|---|---|
| CN | 101410956 A | 4/2009 |
| CN | 101553360 A | 10/2009 |
| CN | 103849318 A | 6/2014 |
| CN | 104245230 A | 12/2014 |
| JP | H06-171944 A | 6/1994 |
| JP | 3062739 B2 | 7/2000 |
| JP | 2001-115144 A | 4/2001 |
| JP | 2001-269859 A | 10/2001 |
| JP | 2003-100670 A | 4/2003 |
| JP | 2004-266155 A | 9/2004 |
| JP | 2006-253420 A | 9/2006 |
| JP | 2007-201187 A | 8/2007 |
| JP | 2008-186898 A | 8/2008 |
| JP | 2010-192556 A | 9/2010 |
| JP | 5038194 B2 | 10/2012 |
| JP | 2013-158884 A | 8/2013 |
| JP | 2015-029001 A | 2/2015 |
| JP | 2015-067774 A | 4/2015 |
| KR | 10-2014-0072410 A | 6/2014 |
| TW | 2012-26547 A | 7/2012 |
| TW | 201350566 A | 12/2013 |
| WO | 2006/076857 A1 | 7/2006 |
| WO | 2007/116770 A1 | 10/2007 |
| WO | 2008/047627 A1 | 4/2008 |
| WO | 2012/102180 A1 | 8/2012 |
| WO | 2013/141225 A1 | 9/2013 |

OTHER PUBLICATIONS

Aug. 7, 2018 Office Action issued in Japanese Patent Application No. 2015-115739.
Apr. 24, 2018 Office Action issued in Japanese Patent Application No. 2015-115739.
Sep. 17, 2019 Office Action issued in Japanese Patent Application No. 2018-247098.
Aug. 2, 2016 International Search Report issued in International Patent Application No. PCT/JP2016/002249.
Watanabe et al.; "The Extraction of Zirconium(IV) from Hydrochloric Acid Solutions by Long-Chain Alkylamine and Alkylammonium Compound;" Journal of the Chemical Society of Japan; 1979; (12), p. 1674-1680.
Dec. 12, 2017 International Preliminary Reporton Patentability issued in International Patent Application No. PCT/JP2016/002249.
Oct. 16, 2019 Office Action issued in Chinese Patent Application No. 201680033515.9.
Dec. 10, 2019 Office Action issued in Japanese Patent Application No. 2018-247098.
Oct. 30, 2019 Office Action issued in Taiwanese Patent Application No. 105117840.
Jul. 9, 2020 Office Action issued in Taiwanese Patent Application No. 105117840.
Oct. 20, 2020 Office Action issued in Chinese Patent Application 201680033515.9.
Fang, Shu-Jen et al., "Epitaxial Growth Technology", Beijing, National Defense Industry Press, 32-37, Jul. 1992.
Apr. 14, 2021 Office Action issued in Chinese Patent Application No. 201680033515.9.

* cited by examiner

POLISHING COMPOSITION, METHOD FOR PRODUCING SAME, AND POLISHING METHOD

TECHNICAL FIELD

The present invention relates to a polishing composition and a method for producing the polishing composition. The present invention also relates to a polishing method using the polishing composition.

BACKGROUND ART

With improvement in the technology for producing semiconductor integrated circuits, high integration and high-speed performance of semiconductor devices are demanded, and stricter flatness is demanded for the surfaces of semiconductor substrates in production processes of fine circuits in semiconductor devices. Accordingly, Chemical Mechanical Polishing (CMP) is an indispensable technology for production processes of semiconductor devices.

CMP is based on, for example, relative movement of a semiconductor substrate such as a single crystal silicon substrate and a polishing pad while the semiconductor substrate is held and pressed against the polishing pad, to which a polishing composition containing abrasive grains and reagents is supplied, attached onto a turn table. This brings a chemical reaction with the reagents and a mechanical polishing effect of the abrasive grains, and makes it possible to grind an uneven surface of the substrate to flatten the surface.

Moreover, improvement in productivity of semiconductor devices is required to reduce the cost, and emphasis is placed on the flatness around the end faces of semiconductor substrates to produce devices over as wide areas of the substrates as possible. Thus, it is required to achieve high flatness in wide areas of semiconductor substrates.

CITATION LIST

Patent Literature

Patent Document 1: Japanese Patent No. 3062739
Patent Document 2: Japanese Patent No. 5038194
Patent Document 3: Japanese Unexamined Patent publication (Kokai) No. 1994-171944

Non Patent Literature

Non Patent Document 1: Watanabe Hiroshi et al., Journal of the Chemical Society of Japan, 1979, (12), p. 1674-1680

SUMMARY OF INVENTION

Technical Problem

However, an area within about several millimeters from the end face of a semiconductor substrate generally tends to have an outer circumferential portion thinner than a central portion of the substrate due to face sag and thus have degraded flatness. This degraded flatness in the outer circumferential portion of the semiconductor substrate causes a yield reduction.

SFQR (Site front surface referenced least squares range) is often used as an index of the semiconductor substrate flatness in production processes of semiconductor devices, especially in a lithography process. SFQR is defined as the range of deviation from a reference plane determined by the least-squares method on a given site having arbitrary dimension. The face sag tends to affect and degrade SFQR of the outer circumferential portion of a semiconductor substrate.

Moreover, the CMP for flattening has a problem of attaching metal impurities to a semiconductor substrate. This is supposed to be caused by diffusion of metal impurities contained in abrasive grains to the semiconductor substrate during polishing processing.

Moreover, a longer time for a polishing process, i.e., a longer time for polishing to a predetermined stock removal leads to lower productivity of semiconductor substrates. Thus, there is a demand for a polishing composition that can achieve high polishing rate to efficiently polish semiconductor substrates.

The present invention was accomplished in view of the above-described problems. It is an object of the present invention to provide a polishing composition that enables semiconductor substrates having high flatness not only in the inner circumferential portion but also in the outer circumferential portion with little contamination due to metal impurities to be obtained at high productivity. Another object of the present invention is to provide a method for producing a polishing composition that enables such a polishing composition to be produced.

Solution to Problem

To achieve this object, the present invention provides a polishing composition, comprising zirconium oxide as abrasive grains, the polishing composition having pH of 11.0 or more and less than 12.5, the zirconium oxide having concentrations of sodium, magnesium, aluminum, potassium, calcium, titanium, chromium, iron, manganese, nickel, copper, zinc, lead, and cobalt of less than 1 ppm each.

Such a polishing composition can prevent metal impurity contamination of a semiconductor substrate and can reduce the influence of face sag by matching the mechanical polishing effect of the zirconium oxide and the chemical polishing effect of the polishing composition, thus enabling high productivity of semiconductor wafers each having high flatness in a wide area of a semiconductor substrate. Using the zirconium oxide as abrasive grains can improve the flatness of a wafer. In the zirconium oxide, when the concentration of each of the above metal elements other than zirconium element is less than 1 ppm, respective concentrations of metal impurities detected from a semiconductor substrate after polishing can be reduced particularly to less than $1.0 \times 10^{10}$ atom/cm$^2$ each. Moreover, when the polishing composition has pH of 11.0 or more, sufficient chemical polishing effect can be obtained, and the flatness of a semiconductor substrate can be improved as well as high polishing rate can be achieved. When the polishing composition has pH of less than 12.5, the chemical polishing effect is not too strong, and the occurrence of face sag can be prevented.

The content of the zirconium oxide is preferably 0.1 to 10 mass % with respect to the whole polishing composition.

When the content of the zirconium oxide, which is abrasive grains, is 0.1 mass % or more, sufficient polishing rate can be achieved. When the content of the zirconium oxide is 10 mass % or less, defects such as scratches on the surface of a semiconductor substrate are not easily generated.

Additionally, the polishing composition of the present invention preferably further comprises either or both of a nonionic surfactant and an anionic surfactant as a water-soluble polymer.

The water-soluble polymer contained in the polishing composition interacts with a surface to be polished of a semiconductor substrate and interacts with a surface of the zirconium oxide, which is abrasive grains, thus providing an effect of protecting the surface to be polished of the semiconductor substrate from defects such as scratches and an effect of preventing cohesion of the zirconium oxide.

The polishing composition of the present invention preferably comprises one or more compounds selected from the group consisting of polyvinyl pyrrolidone, polyvinyl alcohol, polyacrylamide, polyethylene glycol, polyoxyethylene alkyl ether, and polyether as the nonionic surfactant.

In the present invention, the above nonionic surfactant can be suitably used.

Additionally, the polishing composition of the present invention preferably comprises one or more compounds selected from the group consisting of polyacrylic acid or a salt thereof, polysulfonic acid or a salt thereof, and polycarboxylic acid or a salt thereof as the anionic surfactant.

In the present invention, the above anionic surfactant can be suitably used.

Additionally, the content of the water-soluble polymer is preferably 0.001 to 0.5 mass % with respect to the whole polishing composition.

When the concentration of the water-soluble polymer is 0.001 mass % or more with respect to the whole polishing composition, the cohesion preventing effect of the polishing abrasive grains and the protecting effect on the surface to be polished can be sufficiently obtained. When the concentration of the water-soluble polymer is 0.5 mass % or less with respect to the whole polishing composition, reduction of the polishing rate and foaming of the polishing composition can be prevented.

Additionally, the polishing composition of the present invention preferably further comprises an oxidizing agent.

The polishing composition containing an oxidizing agent can oxidize the surface of a semiconductor substrate and thus can more effectively promote polishing.

The content of the oxidizing agent is preferably 0.01 to 1.0 mass % with respect to the whole polishing composition.

When the content of the oxidizing agent is 0.01 mass % or more with respect to the polishing composition, the polishing promoting effect by the oxidizing agent can be sufficiently obtained. When the content of the oxidizing agent is 1.0 mass % or less with respect to the polishing composition, the chemical polishing effect is not too strong, and the occurrence of face sag can be more prevented.

The polishing composition of the present invention preferably comprises hydrogen peroxide as the oxidizing agent.

In the present invention, hydrogen peroxide is suitably used as the oxidizing agent.

Furthermore, to achieve the above object, the present invention provides a polishing method, comprising polishing a semiconductor substrate with any one of the above polishing compositions.

When a semiconductor substrate is polished with the polishing composition of the present invention, semiconductor substrates having high flatness not only in the inner circumferential portion but also in the outer circumferential portion with little contamination due to metal impurities can be obtained at high productivity through polishing.

The semiconductor substrate may be a single crystal silicon substrate.

The polishing method of the present invention is particularly suitable for polishing a single crystal silicon substrate.

Furthermore, to achieve the above object, the present invention provides a method for producing a polishing composition containing zirconium oxide as abrasive grains, the method comprising: preparing zirconium oxide having element concentrations of sodium, magnesium, aluminum, potassium, calcium, titanium, chromium, iron, manganese, nickel, copper, zinc, lead, and cobalt of less than 1 ppm each; adding the prepared zirconium oxide to water; and adding a pH adjuster to a solution containing the zirconium oxide to adjust pH of the solution to 11.0 or more and less than 12.5, wherein a polishing composition is produced by using the solution after adjusting the pH.

Such a producing method enables production of a polishing composition that can improve the polishing rate, increase the flatness not only in the inner circumferential portion but also in the outer circumferential portion of a semiconductor substrate, and reduce contamination due to metal impurities.

Advantageous Effects of Invention

The present invention enables semiconductor substrates having high flatness not only in the inner circumferential portion but also in the outer circumferential portion with little contamination due to metal impurities to be obtained at high productivity.

DESCRIPTION OF EMBODIMENTS

Figure 1:
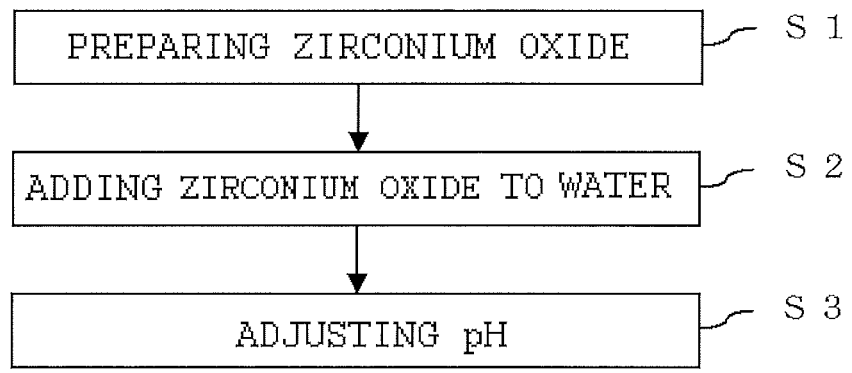
FIG. 1 is a flow chart showing an example of the method for producing a polishing composition of the present invention.

Hereinafter, embodiments of the present invention will be described, but the present invention is not limited thereto.

The polishing composition of the present invention is slurry containing zirconium oxide as abrasive grains, in which the zirconium oxide has element concentrations of sodium, magnesium, aluminum, potassium, calcium, titanium, chromium, iron, manganese, nickel, copper, zinc, lead, and cobalt of less than 1 ppm each. Additionally, the polishing composition of the present invention has pH of 11.0 or more and less than 12.5.

Using the zirconium oxide as abrasive grains increases the polishing rate and the flatness compared with the case using colloidal silica etc. as abrasive grains. In the zirconium oxide, when the concentration of each of the above metal elements other than zirconium element is less than 1 ppm, metal impurities are not easily diffused into a semiconductor substrate during polishing processing, and concentrations of metal impurities detected from the semiconductor substrate after polishing can be reduced particularly to less than $1.0 \times 10^{10}$ atom/cm$^2$ each. When the polishing composition has pH of 11.0 or more, sufficient chemical polishing effect can be obtained, and the flatness of a semiconductor substrate can be improved as well as high polishing rate can be achieved. On the other hand, when the pH is less than 11.0, the polishing composition has insufficient chemical polishing effect, and the flatness of a semiconductor substrate is lowered. Further, the polishing rate decreases, and the productivity degrades. When the polishing composition has pH of less than 12.5, the chemical polishing effect is not too strong, and the occurrence of face sag can be prevented. On the other hand, when the pH is 12.5 or more, the polishing composition has too strong chemical polishing effect and promotes face sag, thus decreasing the flatness of a semiconductor substrate.

In the polishing composition of the present invention, the zirconium oxide preferably has an average primary particle size of 5 nm or more and less than 100 nm. When the primary particle size of the zirconium oxide is 5 nm or more, sufficient polishing rate can be achieved. When the primary particle size of the zirconium oxide is less than 100 nm, the particles are not too large and thus hardly cause scratches.

The primary particle size of the zirconium oxide is calculated from an average value of maximum unidirectional diameters, i.e. Feret diameters, of 100 or more particles measured on particle images obtained by a transmission electron microscope (TEM) or a scanning electron microscope (SEM). The particle distribution of the zirconium oxide particles is preferably in the above particle size range, but the particle size is not particularly limited thereto, and may be appropriately changed depending on the purpose.

The shape of primary particles of the zirconium oxide is not particularly limited and is preferably a spherical shape to prevent the occurrence of polishing damage.

The crystal structure of the zirconium oxide is not particularly limited and may be amorphous, monoclinic crystal system, tetragonal crystal or cubic crystal system. Moreover, the zirconium oxide may have a single crystal phase or multiple crystal phases. The crystal structure may be appropriately selected depending on the purpose.

The content of the zirconium oxide is preferably 0.1 mass % or more and 10 mass % or less, particularly preferably 0.4 mass % or more and 5 mass % or less, with respect to the whole polishing composition. When the content of the zirconium oxide is 0.1 mass % or more, sufficient polishing rate can be achieved. When the content of the zirconium oxide is 10 mass % or less, defects such as scratches are not easily generated on a semiconductor substrate.

In the present invention, as described above, the concentration of each metal impurity other than zirconium contained in the zirconium oxide is less than 1 ppm. Such nanosize zirconium oxide having few metal impurities can be produced by, for example, a hydrothermal synthesis method (for example, see Patent Document 2) using raw materials purified by a solvent extraction method or the like (for example, see Patent Document 1 and Non Patent Document 1), or a hydrolysis method or a precipitation method (for example, see Patent Document 3) although not particularly limited.

Additionally, the polishing composition of the present invention has pH of 11.0 or more and less than 12.5 as described above. To adjust the pH of the polishing composition to 11.0 or more and less than 12.5, a pH adjuster may be added to the polishing composition of the present invention. The kind of the pH adjuster is not particularly limited. Examples thereof include a potassium hydroxide aqueous solution, a tetramethylammonium hydroxide solution, and ammonia water. In addition, the pH adjuster may contain alkali metal such as potassium or alkaline earth metal such as calcium. These metals make little effect on a semiconductor substrate since when contained in a liquid phase of the polishing composition, the metals can be relatively easily removed by cleaning the semiconductor substrate after a polishing process.

Additionally, the polishing composition of the present invention may contain a water-soluble polymer, and preferably contains either or both of a nonionic surfactant and an anionic surfactant as the water-soluble polymer. As the nonionic surfactant, one or more compounds selected from the group consisting of polyvinyl pyrrolidone, polyvinyl alcohol, polyacrylamide, polyethylene glycol, polyoxyethylene alkyl ether, and polyether are preferably contained. As the anionic surfactant, one or more compounds selected from the group consisting of polyacrylic acid or a salt thereof, polysulfonic acid or a salt thereof, and polycarboxylic acid or a salt thereof are preferably contained.

The water-soluble polymer contained in the polishing composition interacts with the surface to be polished and the surface of the zirconium oxide, which is abrasive grains, and thus has effects such as preventing cohesion of the zirconium oxide and protecting the polished surface of a semiconductor substrate. Such effects make it difficult to generate defects such as scratches due to polishing on the surface of a semiconductor substrate. The polymerization degree and the molecular weight of the water-soluble polymer are not particularly limited, and may be appropriately selected depending on the purpose.

The content of the water-soluble polymer is preferably 0.001 to 0.5 mass %, more preferably 0.005 to 0.2 mass %, with respect to the whole polishing composition. When the content of the water-soluble polymer is 0.001 mass % or more, the effect of preventing generation of scratches can be sufficiently obtained. When the content of the water-soluble polymer is 0.5 mass % or less, the polishing rate is not easily reduced, and the polishing composition cannot foam easily.

Additionally, the polishing composition of the present invention preferably further contains an oxidizing agent. As the oxidizing agent, hydrogen peroxide is suitably used. The composition containing such an oxidizing agent can oxidize the surface of a semiconductor substrate and promote polishing more effectively.

The content of the oxidizing agent is preferably 0.01 to 1.0 mass % with respect to the whole polishing composition. When the content of the oxidizing agent is 0.01 mass % or more with respect to the polishing composition, the polishing promoting effect by the oxidizing agent can be sufficiently obtained. When the content of the oxidizing agent is 1.0 mass % or less with respect to the polishing composition, the chemical polishing effect is not too strong, and the occurrence of face sag can be more prevented.

Next, a method for producing the aforementioned polishing composition of the present invention will be described with reference to FIG. 1.

First, particles of zirconium oxide are prepared as abrasive grains (S1 in FIG. 1). As the zirconium oxide, zirconium oxide having element concentrations of sodium, magnesium, aluminum, potassium, calcium, titanium, chromium, iron, manganese, nickel, copper, zinc, lead, and cobalt of less than 1 ppm each is prepared. To measure concentrations of metal elements other than zirconium in the zirconium oxide, for example, ICP-MS (inductively coupled plasma mass spectrometer) analysis may be used.

Then, the prepared zirconium oxide is added to water (S2 in FIG. 1).

Then, a pH adjuster is added to the solution produced by adding the zirconium oxide to water to adjust the pH of the solution to 11.0 or more and less than 12.5 (S3 in FIG. 1). The kind of the pH adjuster is not particularly limited. Examples thereof include a potassium hydroxide aqueous solution, a tetramethylammonium hydroxide solution, and ammonia water.

A polishing composition is produced by using the solution after adjusting the pH. In the method for producing a polishing composition of the present invention, a water-soluble polymer and an oxidizing agent may be further added to the solution containing the zirconium oxide and the pH adjuster to produce the polishing composition. As the water-soluble polymer and the oxidizing agent, the same substances as described above may be used.

Next, a polishing method using the polishing composition of the present invention will be described. The polishing composition of the present invention can be suitably used for both of rough polishing, which is primary polishing, and mirror polishing, which is secondary polishing. In addition, although the following explanation is given in conjunction with the case of single-side polishing of a semiconductor substrate, the polishing composition of the present invention is not limited thereto and can also be used for double-side polishing or polishing of a chamfered portion, of course. In addition, the polishing method of the present invention is especially suitable for polishing a single crystal silicon wafer.

Figure 2:
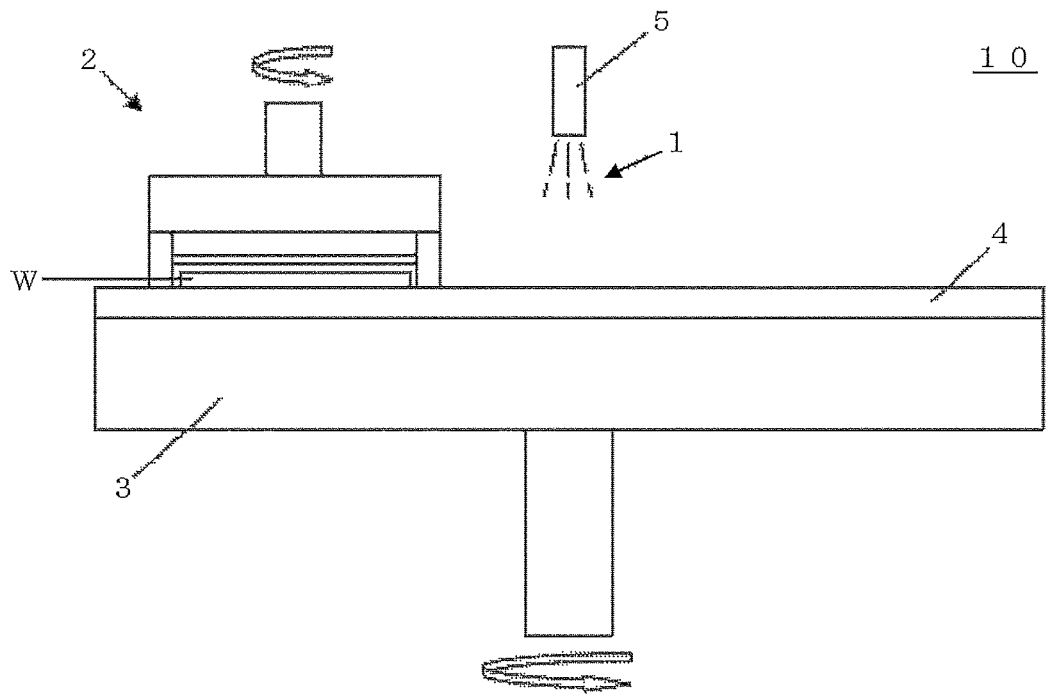
FIG. 2 is a schematic diagram showing an exemplary single-side polishing apparatus that can be used in the polishing method of the present invention.

A single-side polishing apparatus can be, for example, a single-side polishing apparatus 10 that includes a turn table 3 to which a polishing pad 4 is attached, a polishing composition supply mechanism 5 and a polishing head 2 and so on, as shown in FIG. 2.

In such a polishing apparatus 10, a semiconductor substrate W is held by the polishing head 2, and a polishing composition 1 of the present invention is supplied from the polishing composition supply mechanism 5 to the polishing pad 4, while the turn table 3 and the polishing head 2 are rotated respectively to bring the semiconductor substrate W into sliding contact with the polishing pad 4 and thereby to polish the substrate.

Such a polishing method using the polishing composition of the present invention enables semiconductor substrates having high flatness not only in the inner circumferential portion but also in the outer circumferential portion with little contamination due to metal impurities to be obtained at high productivity.

EXAMPLE

Hereinafter, the present invention will be more specifically described with reference to examples and comparative examples, but the present invention is not limited these examples.

Example 1

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 11.5. In this way, a polishing composition was produced.

Example 2

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyethylene glycol having an average molecular weight of 6000 was added to the pure water containing the dispersed zirconium oxide such that the content of the polyethylene glycol was 0.07 mass %. Further, a potassium hydroxide solution was added thereto such that the pH of the solution was 11.5. In this way, a polishing composition was produced.

Example 3

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyvinyl alcohol having an average polymerization degree of 1000 and a saponification degree of 80 to 90 mol % was added to the pure water containing the dispersed zirconium oxide such that the content of the polyvinyl alcohol was 0.07 mass %. Further, hydrogen peroxide was added thereto with a content of 1.0 mass %. Then, a potassium hydroxide solution was added thereto such that the pH of the solution was 11.5. In this way, a polishing composition was produced.

Example 4

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 11.0. In this way, a polishing composition was produced.

Example 5

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 12.4. In this way, a polishing composition was produced.

Comparative Example 1

By ICP-MS analysis, metal impurity concentrations were measured on colloidal silica by setting the element to be measured to sodium, magnesium, aluminum, potassium, calcium, titanium, chromium, iron, manganese, nickel, copper, zinc, lead, and cobalt, and the colloidal silica having respective metal impurity concentrations of less than 1 ppm each and a primary particle size of 34 nm was dispersed to pure water such that the content of the colloidal silica was 1.0 mass %. Then, polyacrylic acid having an average molecular weight of 10000 was added to the pure water containing the dispersed colloidal silica such that the content of the polyacrylic acid was 0.05 mass %. Further, a potassium hydroxide solution was added thereto such that the pH of the solution was 11.5. In this way, a polishing composition using the colloidal silica as abrasive grains was produced.

Comparative Example 2

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of Mg: 20 ppm, Fe: 18 ppm, Al: 11 ppm, Ti: 5 ppm, and the other elements: less than 1 ppm each, and a primary particle size of 30 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 11.5. In this way, a polishing composition, in which element concentrations of Mg, Fe, Al, and Ti in the zirconium oxide were each 1 ppm or more, was produced.

Comparative Example 3

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of Fe: 1 ppm and the other elements: less than 1 ppm each, and a primary particle size of 30 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 11.5. In this way, a polishing composition, in which an element concentration of Fe in the zirconium oxide was 1 ppm or more, was produced.

Comparative Example 4

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyacrylic acid having an average molecular weight of 10000 was added thereto such that the content of the polyacrylic acid was 0.05 mass %. Further, a potassium hydroxide solution was added thereto such that the pH of the solution was 10.5. In this way, a polishing composition having pH of less than 11.0 was produced.

Comparative Example 5

By ICP-MS analysis, metal impurity concentrations were measured on zirconium oxide by setting the element to be measured to sodium, magnesium, aluminum, potassium, calcium, titanium, chromium, iron, manganese, nickel, copper, zinc, lead, and cobalt, and the zirconium oxide having respective metal impurity concentrations of less than 1 ppm each and a primary particle size of 26 nm was dispersed to pure water such that the content of the zirconium oxide was 1.0 mass %. Then, polyacrylic acid having an average molecular weight of 10000 was added to the pure water containing the dispersed zirconium oxide such that the content of the polyacrylic acid was 0.05 mass %. Further, a potassium hydroxide solution was added thereto such that the pH of the solution was 12.8. In this way, a polishing composition having pH of 12.5 or more was produced.

A single crystal silicon substrate having a diameter of 12 inches (300 mm) was subjected to single-side polishing with the polishing compositions in Examples 1 to 5 and Comparative Examples 1 to 5 under the following polishing conditions. Poli-762 (manufactured by G&P Technology, Inc.) as the polishing apparatus and IC1000 (manufactured by Nitta Haas Inc.) as the polishing pad were used. The load applied to the substrate to be polished was 193 g/cm$^2$; the rotational speed of the turn table was 70 rpm; the rotational speed of the head was 70 rpm; and the supply rate of the polishing composition was 100 mL/min.

After polishing, the polishing rate was calculated. Moreover, SFQR of the semiconductor substrate after polishing was measured, assuming an outer circumferential exclusion area of 2 mm and a site size of 25 mm×25 mm. Further, the semiconductor substrate after polishing was subjected to known RCA cleaning with SC-1 (a mixed solution of 29% ammonia water, 30% hydrogen peroxide water, and pure water, the volume ratio was ammonia water:hydrogen peroxide water:pure water=1:1:10, 75° C., immersion for 5 minutes) and SC-2 (a mixed solution of 30% hydrochloric acid, 30% hydrogen peroxide water, and pure water, the volume ratio was hydrochloric acid:hydrogen peroxide water:pure water=1:1:10, 75° C., immersion for 5 minutes). Thereafter, arbitrary five points on the substrate surface were analyzed by measuring elements, namely, sodium, magnesium, aluminum, potassium, calcium, titanium, chromium, iron, manganese, nickel, copper, zinc, lead, and cobalt through a total reflection X-ray fluorescence analysis (TREX) to examine contamination due to metal impurities.

The polishing rate, maximum SFQR, and concentrations of metal impurities on the single crystal silicon substrate are summarized in Table 1. With respect to the impurities, the detected value of each measured element was evaluated based on the following criteria, and the evaluation results are shown.

Good: less than $1.0 \times 10^{10}$ atom/cm$^2$
Fair: $1.0 \times 10^{10}$ or more and less than $1.0 \times 10^{11}$ atom/cm$^2$
Poor: $1.0 \times 10^{11}$ atom/cm$^2$ or more

TABLE 1

| | Polishing rate (μm/min) | Maximum SFQR (nm) | Metal impurity concentration | | | | | | | | | | | | | |
|---|---|---|---|---|---|---|---|---|---|---|---|---|---|---|---|---|
| | | | Na | Mg | Al | K | Ca | Ti | Cr | Fe | Mn | Ni | Cu | Zn | Pb | Co |
| Example 1 | 0.24 | 46 | Good | Good | Good | Good | Good | Good | Good | Good | Good | Good | Good | Good | Good | Good |
| Example 2 | 0.21 | 42 | Good | Good | Good | Good | Good | Good | Good | Good | Good | Good | Good | Good | Good | Good |
| Example 3 | 0.29 | 50 | Good | Good | Good | Good | Good | Good | Good | Good | Good | Good | Good | Good | Good | Good |
| Example 4 | 0.20 | 43 | Good | Good | Good | Good | Good | Good | Good | Good | Good | Good | Good | Good | Good | Good |
| Example 5 | 0.32 | 63 | Good | Good | Good | Good | Good | Good | Good | Good | Good | Good | Good | Good | Good | Good |
| Comparative Example 1 | 0.14 | 89 | Good | Good | Good | Good | Good | Good | Good | Good | Good | Good | Good | Good | Good | Good |
| Comparative Example 2 | 0.23 | 46 | Good | Fair | Fair | Good | Good | Good | Good | Poor | Good | Good | Good | Good | Good | Good |
| Comparative Example 3 | 0.25 | 48 | Good | Good | Good | Good | Good | Good | Good | Fair | Good | Good | Good | Good | Good | Good |
| Comparative Example 4 | 0.10 | 35 | Good | Good | Good | Good | Good | Good | Good | Good | Good | Good | Good | Good | Good | Good |
| Comparative Example 5 | 0.41 | 107 | Good | Good | Good | Good | Good | Good | Good | Good | Good | Good | Good | Good | Good | Good |

As shown in Table 1, in Examples 1 to 5, the concentration of each metal impurity detected from the surface of the semiconductor substrate after polishing was less than $1.0 \times 10^{10}$ atom/cm$^2$, and impurity contamination of the semiconductor substrate due to polishing could be prevented. Moreover, Examples 1 to 5 showed sufficient polishing rate and reduced maximum SFQR since especially the outer circumferential portion of the semiconductor substrate had little face sag, resulting in good flatness.

By contrast, as shown in Table 1, when colloidal silica was used as abrasive grains like Comparative Example 1, the polishing rate was low, the maximum SFQR was large, and the flatness was degraded, compared with Examples. Moreover, when zirconium oxide having concentrations of metal elements other than zirconium of 1 ppm or more was used as abrasive grains like Comparative Examples 2 and 3, metal impurities having a concentration of $1.0 \times 10^{10}$ atom/cm$^2$ or more were detected from the surface of the semiconductor substrate after polishing. Moreover, when the pH of the polishing composition was less than 11.0 like Comparative Example 4, the chemical polishing effect could not be sufficiently obtained, and the polishing rate was decreased. Moreover, when the pH of the polishing composition was 12.5 or more like Comparative Example 5, the chemical polishing effect was so strong that face sag was advanced, and the maximum SFQR was significantly increased.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polishing composition, comprising zirconium oxide as abrasive grains,
   the polishing composition having pH of 11.0 or more and less than 12.5, the zirconium oxide having element concentrations of sodium, magnesium, aluminum, potassium, calcium, titanium, chromium, iron, manganese, nickel, copper, zinc, lead, and cobalt of less than 1 ppm each,
   wherein the abrasive grains of the zirconium oxide have an average primary particle size of 5 nm or more and less than 100 nm.

2. The polishing composition according to claim 1, wherein the content of the zirconium oxide is 0.1 to 10 mass % with respect to the whole polishing composition.

3. The polishing composition according to claim 1, further comprising either or both of a nonionic surfactant and an anionic surfactant as a water-soluble polymer.

4. The polishing composition according to claim 2, further comprising either or both of a nonionic surfactant and an anionic surfactant as a water-soluble polymer.

5. The polishing composition according to claim 3, wherein the polishing composition comprises one or more compounds selected from the group consisting of polyvinyl pyrrolidone, polyvinyl alcohol, polyacrylamide, polyethylene glycol, polyoxyethylene alkyl ether, and polyether as the nonionic surfactant.

6. The polishing composition according to claim 4, wherein the polishing composition comprises one or more compounds selected from the group consisting of polyvinyl pyrrolidone, polyvinyl alcohol, polyacrylamide, polyethylene glycol, polyoxyethylene alkyl ether, and polyether as the nonionic surfactant.

7. The polishing composition according to claim 3, wherein the polishing composition comprises one or more compounds selected from the group consisting of polyacrylic acid or a salt thereof, polysulfonic acid or a salt thereof, and polycarboxylic acid or a salt thereof as the anionic surfactant.

8. The polishing composition according to claim 4 wherein the polishing composition comprises one or more compounds selected from the group consisting of polyacrylic acid or a salt thereof, polysulfonic acid or a salt thereof, and polycarboxylic acid or a salt thereof as the anionic surfactant.

9. The polishing composition according to claim 3, wherein the content of the water-soluble polymer is 0.001 to 0.5 mass % with respect to the whole polishing composition.

10. A polishing composition according to claim 5, wherein the content of the water-soluble polymer is 0.001 to 0.5 mass % with respect to the whole polishing composition.

11. The polishing composition according to claim 7, wherein the content of the water-soluble polymer is 0.001 to 0.5 mass % with respect to the whole polishing composition.

12. The polishing composition according to claim 1, further comprising an oxidizing agent.

13. The polishing composition according to claim 2, further comprising an oxidizing agent.

14. The polishing composition according to claim 12, wherein the content of the oxidizing agent is 0.01 to 1.0 mass % with respect to the whole polishing composition.

15. The polishing composition according to claim 13, wherein the content of the oxidizing agent is 0.01 to 1.0 mass % with respect to the whole polishing composition.

16. The polishing composition according to claim 12, wherein the polishing composition comprises hydrogen peroxide as the oxidizing agent.

17. The polishing composition according to claim 14, wherein the polishing composition comprises hydrogen peroxide as the oxidizing agent.

18. A polishing method, comprising polishing a semiconductor substrate with the polishing composition according to claim 1.

19. The polishing method according to claim 18, wherein the semiconductor substrate is a single crystal silicon substrate.

20. A method for producing a polishing composition containing zirconium oxide as abrasive grains, the method comprising:

preparing zirconium oxide having element concentrations of sodium, magnesium, aluminum, potassium, calcium, titanium, chromium, iron, manganese, nickel, copper, zinc, lead, and cobalt of less than 1 ppm each;

adding the prepared zirconium oxide to water; and adding a pH adjuster to a solution containing the zirconium oxide to adjust pH of the solution to 11.0 or more and less than 12.5, wherein a polishing composition is produced by using the solution after adjusting the pH.

21. The polishing composition according to claim 3, wherein the nonionic surfactant comprises one or more compounds selected from the group consisting of polyvinyl pyrrolidone, polyvinyl alcohol, polyacrylamide, polyoxyethylene alkyl ether, and polyether, and wherein the anionic surfactant comprises one or more compounds selected from the group consisting of polyacrylic acid, polysulfonic acid and polycarboxylic acid.

* * * * *